(12) United States Patent
Tiwari et al.

(10) Patent No.: US 10,454,466 B1
(45) Date of Patent: Oct. 22, 2019

(54) BIASING CASCODE TRANSISTORS OF AN OUTPUT BUFFER CIRCUIT FOR OPERATION OVER A WIDE RANGE OF SUPPLY VOLTAGES

(71) Applicant: STMicroelectronics International N.V., Schiphol (NL)

(72) Inventors: Manoj Kumar Kumar Tiwari, Unnao (IN); Saiyid Mohammad Irshad Rizvi, New Delhi (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 16/253,410

(22) Filed: Jan. 22, 2019

Related U.S. Application Data

(63) Continuation of application No. 15/945,049, filed on Apr. 4, 2018, now Pat. No. 10,224,922.

(51) Int. Cl.
*H03K 19/0185* (2006.01)
*H03K 17/082* (2006.01)
*G05F 3/16* (2006.01)
*H03K 17/687* (2006.01)

(52) U.S. Cl.
CPC .......... *H03K 17/0822* (2013.01); *G05F 3/16* (2013.01); *H03K 17/687* (2013.01); *H03K 19/018521* (2013.01)

(58) Field of Classification Search
CPC ............. H03K 17/0822; H03K 17/687; H03K 19/018521; G05F 3/16
See application file for complete search history.

(56) References Cited

U.S. PATENT DOCUMENTS

| 6,961,270 B2 * | 11/2005 | Do ............................ G11C 5/14 365/189.09 |
| 8,860,497 B1 | 10/2014 | Pattnayak et al. |
| 9,641,141 B1 | 5/2017 | Zheng et al. |

OTHER PUBLICATIONS

Monga, S., et al: "A 73µW 400Mbps Stress Tolerant 1.8V-3.6V Driver in 40nm CMOS," 2011 IEEE, pp. 187-190.
Neri, F., et al: "Low-Power, Wide Supply Voltage Bandgap Reference Circuit in 28nm CMOS," 2015 IEEE Jordan Conference on Applied Electrical Engineering and Computing Technologies (AEECT) (6 pages).

* cited by examiner

*Primary Examiner* — Jung Kim
(74) *Attorney, Agent, or Firm* — Crowe & Dunlevy

(57) ABSTRACT

An output stage of an output buffer circuit includes a first drive transistor and a first cascode transistor (coupled in series between a first supply node and an output node) and a second drive transistor and a second cascode transistor (coupled in series between the output node and a second supply node). Gates of the first and second cascode transistors are biased with first and second bias voltages, respectively. The first bias voltage equals the first supply voltage at the first supply node when the first supply voltage is less than a threshold, and is fixed at a fixed voltage for any first supply voltage exceeding the threshold voltage. The second bias voltage equals a fixed voltage when the first supply voltage is less than a threshold voltage, and is offset from the first supply voltage by a fixed difference for any first supply voltage exceeding the threshold.

17 Claims, 4 Drawing Sheets

US 10,454,466 B1

BIASING CASCODE TRANSISTORS OF AN OUTPUT BUFFER CIRCUIT FOR OPERATION OVER A WIDE RANGE OF SUPPLY VOLTAGES

CROSS REFERENCE TO RELATED APPLICATIONS

This application is a continuation of U.S. Ser. No. 15/945,049 filed Apr. 4, 2018, the disclosure of which is incorporated by reference.

TECHNICAL FIELD

The present invention relates to an output buffer circuit.

BACKGROUND

Input/output buffer circuits are commonly used components of an integrated circuit and are used as a signal interface between internal circuitry and the input/output pad which permits the electrical connection to external circuitry. Often times the input/output buffer circuit is powered from a higher supply voltage than the internal circuitry, thus requiring a level shifting of signals between power supply domains. There may exist instances where the higher supply voltage at the input/output buffer circuit is provided over a range of voltages, such as when the integrated circuit is operable at two or more voltage levels or the supply voltage for the integrated circuit varies. This makes the design of the input/output buffer circuit more complicated because higher supply voltage levels may stress and damage transistors of the input/output buffer circuit.

SUMMARY

In an embodiment, an output buffer circuit comprises: an output stage powered from a first supply node and second supply node and configured to drive an output pad, said output stage comprising a first drive transistor and a first cascode transistor, the first drive transistor and first cascode transistor being coupled in series between the first supply node and an output node coupled to said output pad, wherein a gate of the first cascode transistor is biased by a first bias voltage; and a bias voltage generator circuit configured to generate said first bias voltage, wherein the first bias voltage is set at a second supply voltage at the second supply node for any first supply voltage at the first supply node that is less than a threshold voltage, and wherein the first bias voltage is equal to a difference between the first supply voltage and the fixed voltage when the first supply voltage exceeds the threshold voltage.

The output stage further comprises a second drive transistor and a second cascode transistor, the second drive transistor and second cascode transistor being coupled in series between the second supply node and the output node, wherein a gate of the second cascode transistor is biased by a second bias voltage. The bias voltage generator circuit is further configured to generate said second bias voltage, wherein the second bias voltage is equal to the first supply voltage when the first supply voltage is less than the threshold voltage, and wherein the first bias voltage is set at the fixed voltage for any first supply voltage exceeding the threshold voltage.

In an embodiment, a method is presented for biasing an output buffer circuit powered from a first supply node and second supply node and which includes an output stage configured to drive an output pad, said output stage comprising a first drive transistor and a first cascode transistor, the first drive transistor and first cascode transistor being coupled in series between a first supply node and an output node coupled to said output pad. The method comprises: biasing a gate of the first cascode transistor with a first bias voltage; generating said first bias voltage to be set at a second supply voltage at the second supply node for any first supply voltage less than a threshold voltage; and generating said first bias voltage to be equal to a difference between a first supply voltage at the first supply node and a fixed voltage when the first supply voltage exceeds the threshold voltage.

The output stage of the output buffer circuit further comprises a second drive transistor and a second cascode transistor, the second drive transistor and second cascode transistor being coupled in series between a second supply node and the output node. The method further comprises: biasing a gate of the second cascode transistor with a second bias voltage; generating said second bias voltage to be equal to the first supply voltage when the first supply voltage is less than the threshold voltage; and generating said second bias voltage to be set at the fixed voltage for any first supply voltage exceeding the threshold voltage.

BRIEF DESCRIPTION OF THE DRAWINGS

For a better understanding of the embodiments, reference will now be made by way of example only to the accompanying figures in which.

DETAILED DESCRIPTION

Figure 1:
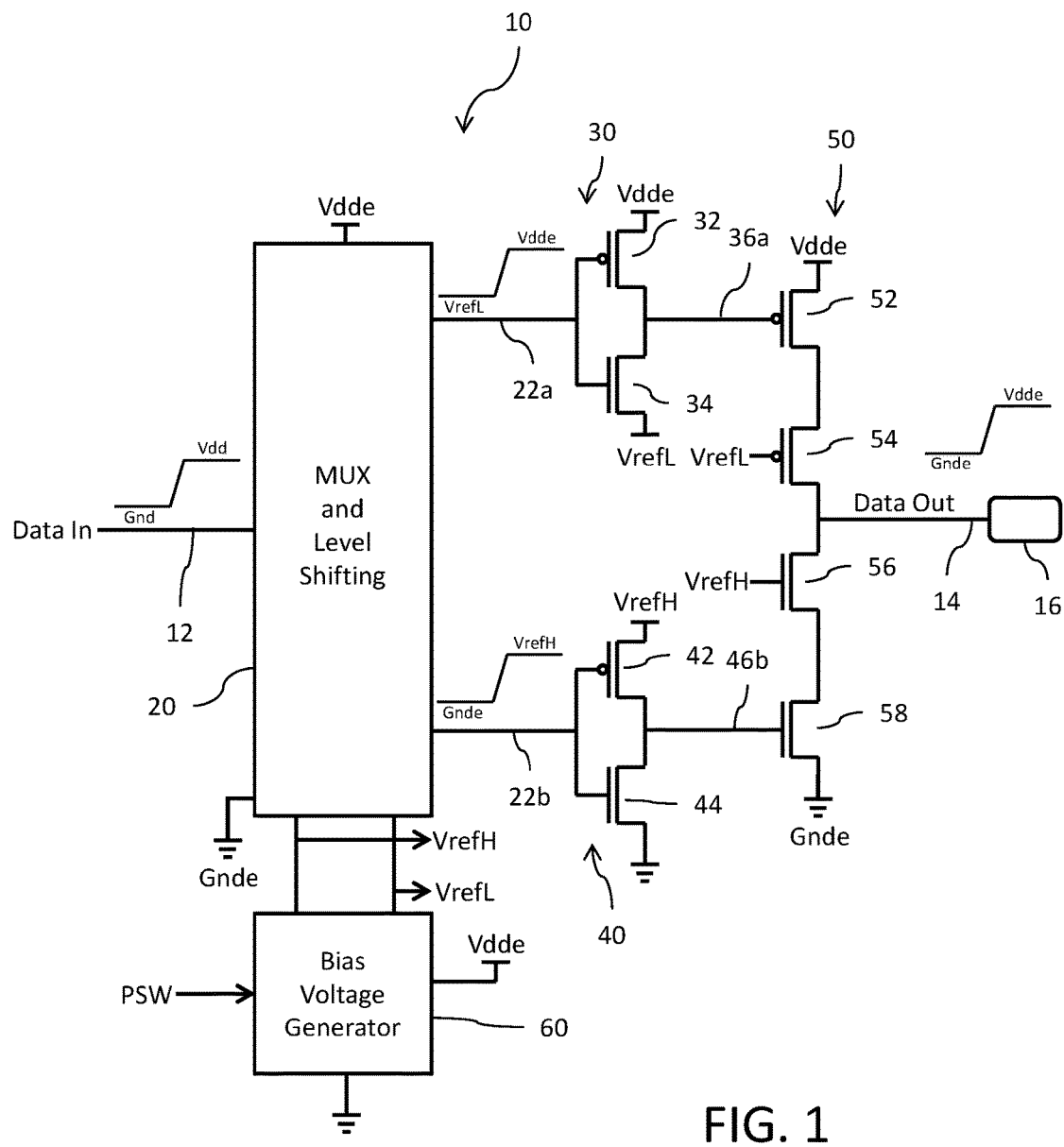
FIG. 1 is a circuit diagram of an output buffer circuit.

Reference is now made to FIG. 1 which shows a circuit diagram of an output buffer circuit 10. The output buffer circuit 10 receives a data signal (Data In) 12 generated from internal circuitry of an integrated circuit chip (the internal circuitry may comprise, for example, a core processing circuit or a memory circuit). The internal circuitry is powered from a low power supply domain having a positive voltage Vdd and a ground voltage Gnd, and thus the data signal 12 has a first logic level (for example, logic "1") at the Vdd voltage level and a second logic level (for example, logic "0") at the Gnd voltage level. The output buffer circuit 10, however, is powered from a high power supply domain having a positive voltage Vdde (where Vdde>Vdd) and a ground voltage Gnde. The output buffer circuit 10 operates to translate the lower voltage level for the data signal 12 in the low power supply domain (Vdd/Gnd) to the higher voltage level for the output signal (Data Out) 14 in the high power supply domain (Vdde/Gnde) for output to the integrated circuit pad 16. Thus, the output signal 14 has a first logic level (for example, logic "1") at the Vdde voltage level and a second logic level (for example, logic "0") at the Gnde voltage level.

The output buffer circuit 10 includes a multiplexing (MUX) and level shifting circuit 20 that is powered by the high power supply domain. The data signal 12 is received at an input of the multiplexing (MUX) and level shifting circuit 20. The circuit 20 operates to level shift the data signal 12 to generate a first level shifted data signal 22a and second level shifted data signal 22b. The first level shifted data signal 22a has a first logic level (for example, logic "1") at the Vdde voltage level and a second logic level (for example, logic "0") at a low reference VrefL voltage level. The second level shifted data signal 22b has a first logic level (for example, logic "1") at a high reference VrefH voltage level and a second logic level (for example, logic "0") at the ground Gnde voltage level.

The output buffer circuit 10 further includes a first CMOS inverter circuit 30. The first level shifted data signal 22a is applied to an input of the first CMOS inverter circuit 30. The circuit 30 includes a p-channel MOS transistor 32 having a source-drain path coupled in series with the source-drain path of an n-channel MOS transistor 34. The source terminal of transistor 32 is connected to receive the Vdde voltage level and the source terminal of the transistor 34 is connected to receive the low reference VrefL voltage level. The gate terminals of the transistors 32 and 34 are connected together to receive the first level shifted data signal 22a. The common drain terminals of the transistors 32 and 34 output an inverted first level shifted data signal 36a. The inverted first level shifted data signal 36a thus has a first logic level (for example, logic "1") at the Vdde voltage level and a second logic level (for example, logic "0") at a low reference VrefL voltage level.

The output buffer circuit 10 further includes a second CMOS inverter circuit 40. The second level shifted data signal 22b is applied to an input of the second CMOS inverter circuit 40. The circuit 40 includes a p-channel MOS transistor 42 having a source-drain path coupled in series with the source-drain path of an n-channel MOS transistor 44. The source terminal of transistor 42 is connected to receive the high reference VrefH voltage level and the source terminal of the transistor 44 is connected to receive the ground Gnde voltage level. The gate terminals of the transistors 42 and 44 are connected together to receive the first level shifted data signal 22b. The common drain terminals of the transistors 42 and 44 output an inverted second level shifted data signal 46b. The inverted second level shifted data signal 46b thus also has a first logic level (for example, logic "1") at a high reference VrefH voltage level and a second logic level (for example, logic "0") at the ground Gnde voltage level.

The output buffer circuit 10 further includes an output stage 50 that receives the inverted first level shifted data signal 36a and the inverted second level shifted data signal 46b and drives the pad 16 with the output signal 14. The output stage 50 includes a p-channel MOS drive transistor 52, a p-channel MOS cascode transistor 54, an n-channel MOS cascode transistor 56 and n-channel MOS drive transistor 58 whose source-drain paths are coupled in series with each other. The source terminal of transistor 52 is connected to receive the Vdde voltage level and the drain terminal of transistor 52 is connected to the source terminal of transistor 54. The source terminal of transistor 58 is connected to receive the Gnd voltage level and the drain terminal of transistor 58 is connected to the source terminal of transistor 56. The common drain terminals of transistors 54 and 56 are connected at an output node to the pad 16 and generate the output signal 14. The inverted first level shifted data signal 36a is applied to the gate terminal of the p-channel MOS drive transistor 52 and the inverted second level shifted data signal 46b is applied to the gate terminal of the n-channel MOS drive transistor 58. The low reference VrefL voltage is applied to the gate terminal of the p-channel MOS cascode transistor 54 and the high reference VrefH voltage is applied to the gate terminal of the n-channel MOS cascode transistor 56.

Within the circuit 20 the transistors for performing the multiplexing operation are low threshold voltage, thin gate oxide devices (referred to in the art as GO1 type transistors) fabricated at an advanced technology node of, for example, 32 nm or 28FDSOI, etc., while the transistors for performing the level shifting operation are high threshold voltage, thicker gate oxide devices (referred to in the art as GO2 type transistors) fabricated at an advanced technology node of, for example, 32 nm or 28FDSOI, etc. The maximum allowable operating voltage across the terminals of the GO2 devices is about 1.98 V. However, the Vdde voltage level may have a permitted range from 1.6 V to 3.6 V. The circuit configuration shown in FIG. 1 for the CMOS inverters and the cascode transistors supports operation of the circuit 10 over such a wide Vdde voltage range.

The output buffer circuit 10 further includes a bias voltage generator circuit 60. The low reference VrefL voltage and the high reference VrefH voltage are generated from the voltages of the high power supply domain by the bias voltage generator circuit 60. More specifically, the low reference VrefL voltage and the high reference VrefH voltage levels are dependent on a selection of the Vdde voltage. The circuit receives a supply selection signal PSW that identifies the selected operating voltage Vdde relative to a certain voltage value, such as, for example, 1.8 V. If the PSW signal indicates that the Vdde voltage is less than or equal to the certain voltage value, the circuit 60 sets the low reference VrefL voltage at the Gnde voltage and the high reference VrefH voltage equals the Vdde voltage. If the PSW signal indicates that the Vdde voltage is greater than the certain voltage value, the circuit 60 causes the low reference VrefL voltage to equal a first fraction F1 of the Vdde voltage and causes the high reference VrefH voltage to equal a second fraction F2 of the Vdde voltage.

As an example, consider the first fraction F1=0.45 and the second fraction F2=0.55. So, for Vdde=3.0 V, VrefL=1.35 V and VrefH=1.65 V. The gate-to-source voltage of the transistor in this case is 3.0 V−1.35 V=1.65 V. For Vdde=3.6V, VrefL=1.62 V and VrefH=1.98 V. The gate-to-source voltage of the transistor in this case is 3.6 V−1.62 V=1.98 V. Thus, it will be noted that there is a variation in gate-to-source voltage with a corresponding variation in Vdde voltage.

There are some drawbacks with this solution for circuit 60 generation of the low reference VrefL voltage and the high reference VrefH voltage: it is not well suited for a continuous wide range of the Vdde supply voltage because operation is driven by the logic state of the PSW signal; the reference voltage VrefL and VrefH levels applied by the fractions F1 and F2 may limit driver current by reducing driving voltage (gate-to-source voltage) of the transistors in circuit 50; there is a reduction in speed which corresponds to the reduced gate-to-source voltage of the MOS driver transistors; the circuit imposes voltage boundaries on the customer; the PSW signal requires a separate pad for the integrated circuit; and glitch concerns exist with respect to pad 16 during power ramping due to variation of the reference voltages.

Figure 2:
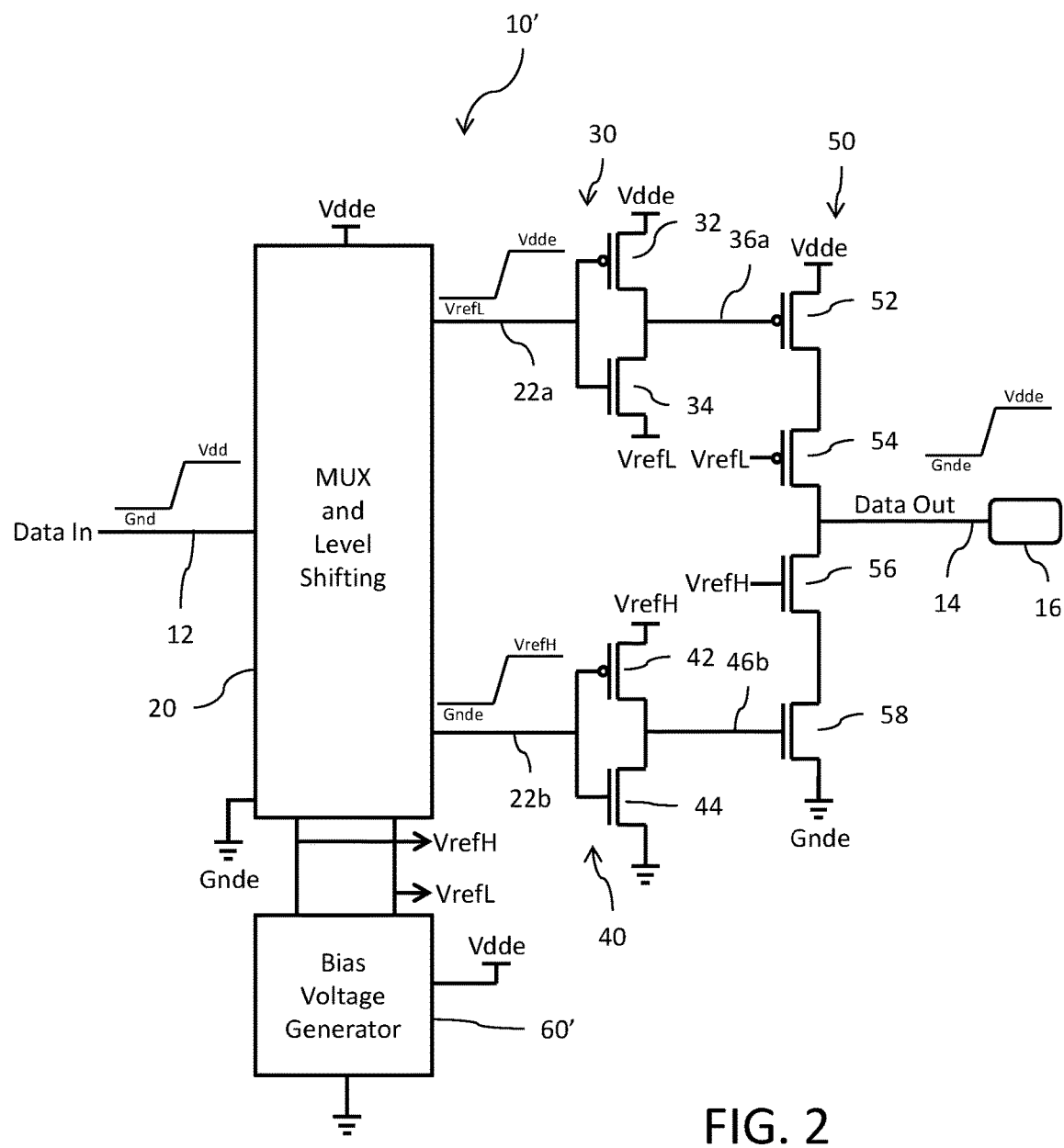
FIG. 2 is a circuit diagram of an output buffer circuit.

Reference is now made to FIG. 2 which shows a circuit diagram of an output buffer circuit 10'. Like reference numbers in FIG. 2 refer to like or similar components of FIG. 1 and for sake of brevity will not be described again. The reader is referred to discussion herein of FIG. 1. The circuit 10' of FIG. 2 differs from the circuit 10 of FIG. 1 in the configuration and operation of the bias voltage generator circuit 60' for generating the low reference VrefL voltage and the high reference VrefH voltage from the voltages of the high power supply domain.

With the circuit 60', the low reference VrefL voltage and the high reference VrefH voltage levels are dependent on a sensed level of the Vdde voltage to support operation over a wide Vdde voltage range. There is no reliance on a supply selection signal PSW to drive the selection of the voltage levels. Furthermore, there is no fixed fractional relationship that governs both of the VrefL and VrefH levels relative to Vdde.

If the sensed Vdde voltage is less than or equal to a threshold voltage (Vthresh) value, such as, for example, 1.98 V, the circuit 60' sets (i.e., fixes) the low reference VrefL voltage at the Gnde voltage and the high reference VrefH voltage equals the Vdde voltage. If the Vdde voltage is greater than the threshold voltage value, the circuit 60' sets (i.e., fixes) the high reference VrefH voltage at a fixed voltage Vfix level (for example, a voltage of 1.8 V) and the low reference VrefL voltage equals the Vdde voltage minus the fixed voltage level (i.e., Vdde−Vfix; in other words Vdde−VrefH because Vfix=VrefH in this mode of operation).

Figure 3:
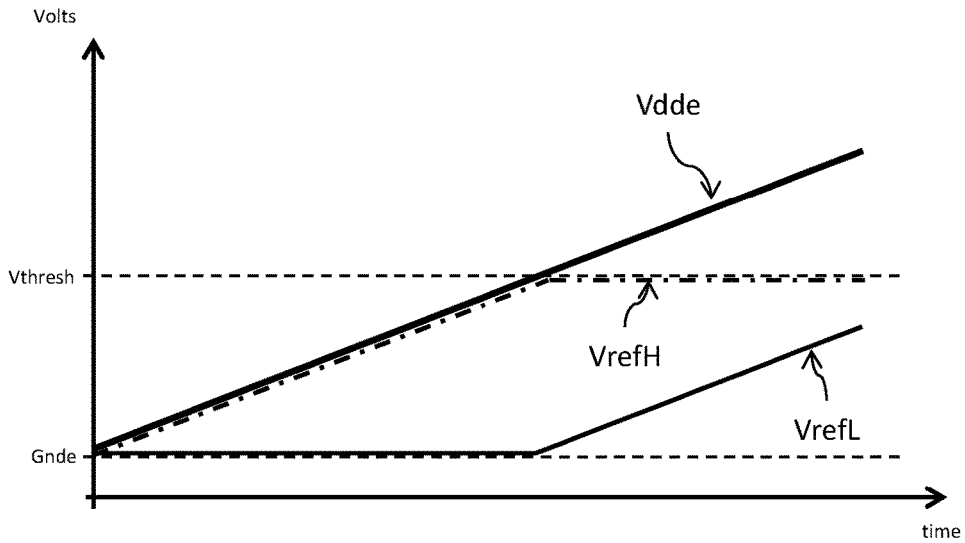
FIG. 3 is a graph showing reference voltage VrefL and VrefH levels for the circuit of FIG. 2 as a function of change in supply voltage.

The operation of the circuit 60' is illustrated in the graph of FIG. 3 which shows the relationship of reference voltage VrefL and VrefH levels to change in the Vdde supply voltage level.

So, in an example, for Vdde=3.0 V, VrefH=Vfix=1.8 V and VrefL=(Vdde−Vfix)=1.2 V. The gate-to-source voltage of the transistor in this case is 3.0 V−1.8 V=1.8 V. For Vdde=3.6V, VrefL=1.8 V and VrefH=1.8 V. The gate-to-source voltage of the transistor in this case is 3.6 V−1.2 V=1.8 V. Thus, in contrast to the FIG. 1 implementation, it will be noted that there is no variation in gate-to-source voltage with a corresponding variation in Vdde voltage for the FIG. 2 implementation.

There are a number of advantages with this solution for circuit 60' generation of the low reference VrefL voltage and the high reference VrefH voltage: the driving voltage (gate-to-source voltage) of the transistors in circuit 50 does not vary with change in Vdde voltage (see above); the driving voltages of the transistors in circuit 50 are higher than in the FIG. 1 implementation, and this permits operation at higher frequencies; stress protection is maintained; the circuit supports a wide range of voltage for Vdde; and glitch-free power sequencing is supported.

Figure 4:
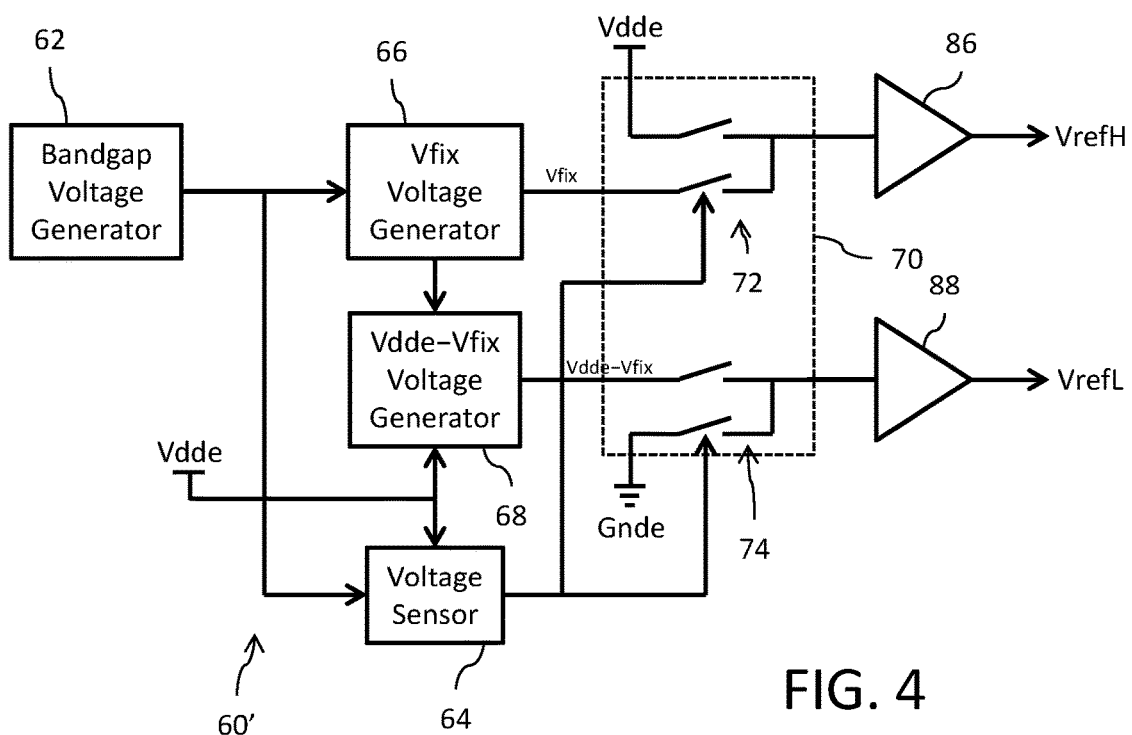
FIG. 4 is a circuit diagram of a bias voltage generator circuit for use in the circuit of FIG. 2.

Reference is now made to FIG. 4 which shows a circuit diagram of the bias voltage generator circuit 60' for use in the circuit 10' of FIG. 2. The circuit 60' is powered from the high power supply domain (Vdde/Gnde). A bandgap voltage generator circuit 62 generates a bandgap voltage Vbg (of, for example, 0.6 V or 0.8 V) from the Vdde supply voltage using any suitable bandgap voltage generator circuit known to those skilled in the art. The bandgap voltage Vbg is processed in a voltage sensing circuit 64 to generate the threshold voltage Vthresh which is then compared to a voltage derived from the Vdde supply voltage, for example using a resistive voltage divider circuit, to generate a voltage sense signal Vsense. The voltage sense signal Vsense has a first logic state if the voltage derived from the Vdde voltage is less than or equal to the threshold voltage Vthresh and has a second logic state if the voltage derived from the Vdde voltage is greater than the threshold voltage Vthresh. The bandgap voltage Vbg is provided as a reference voltage in a voltage regulator circuit 66 that is configured to generate the fixed voltage Vfix. The voltage regulator circuit 66 may, for example, be of the low drop out (LDO) type well known to those skilled in the art. The Vdde voltage and fixed voltage Vfix are processed in a voltage differencing circuit 68 that is configured to generate the Vdde−Vfix voltage difference. The voltage differencing circuit 68 may be implemented in any suitable manner including use of either a voltage differentiation technique or a current differentiation technique well known to those skilled in the art. A switching circuit 70 operates to selectively choose, in response to the logic state of the voltage sense signal Vsense, between: a) the fixed voltage Vfix and the Vdde voltage through actuation of switches 72 for output as the high reference VrefH voltage, and b) the Vdde−Vfix voltage difference and the Gnde voltage through actuation of switches 74 for output as the low reference VrefL voltage. If the voltage sense signal Vsense has the first logic state (because the voltage derived from the Vdde voltage is less than or equal to the threshold voltage Vthresh), the switches 72 are actuated to select the Vdde voltage for output as the high reference VrefH voltage and the switches 74 are actuated to select the Gnde voltage for output as the low reference VrefL voltage. Conversely, if the voltage sense signal Vsense has the second logic state (because the voltage derived from the Vdde voltage is greater than the threshold voltage Vthresh), the switches 72 are actuated to select the Vfix voltage for output as the high reference VrefH voltage and the switches 74 are actuated to select the Vdde−Vfix voltage difference for output as the low reference VrefL voltage.

The bias voltage generator circuit 60' may further include voltage buffer circuits 86 and 88 for buffering the high reference VrefH voltage and the low reference VrefL voltage, respectively, prior to output to drive the gate terminals of the cascode transistors in the output stage 50.

Figure 5:
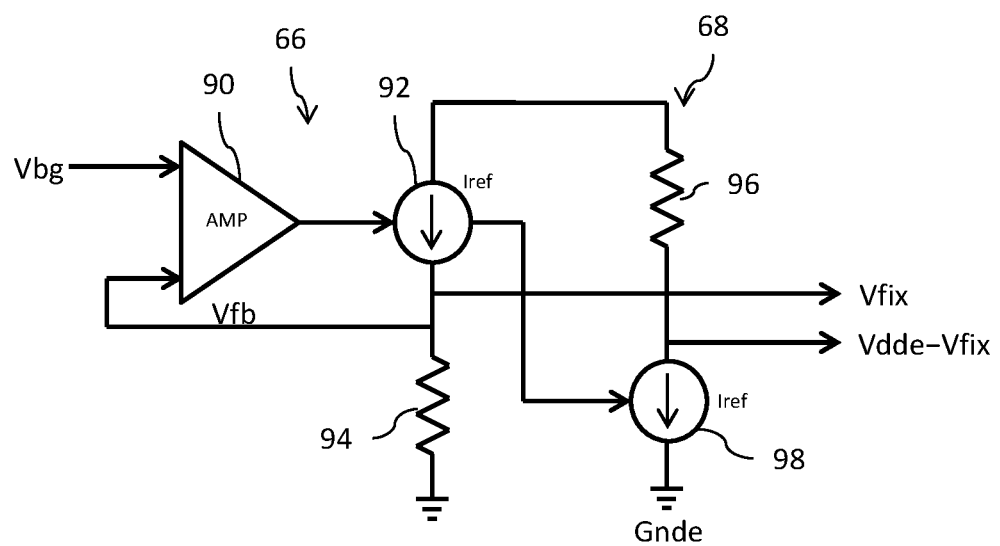
FIG. 5 is a circuit diagram of a circuit within the bias voltage generator circuit of FIG. 4.

Reference is now made to FIG. 5 which shows a circuit diagram for an embodiment of the voltage regulator circuit 66 and voltage differencing circuit 68. The voltage regulator circuit 66 comprises a low drop out (LDO) voltage regulator formed by a differential amplifier 90, a current source 92 and a resistor 94. The differential amplifier 90 has a non-inverting input that receives the bandgap voltage Vbg and an inverting input that receives a feedback voltage Vfb. The current source 92 is supplied from the Vdde voltage and generates a reference current Iref in response to the output of the differential amplifier 90. The reference current Iref is applied to the resistor 94, which is connected in series with the current source 92 between the Vdde voltage and the Gnde voltage, to produce both the feedback voltage Vfb and the Vfix voltage (wherein Vfix=Vfb). The voltage differencing circuit 68 comprises a current source 96 and a resistor 98. The resistor 98 and current source 96 are connected in series between the Vdde voltage and the Gnde voltage. The current source 96 is coupled to the output of the differential amplifier 90 to generate a replica of the reference current Iref. This replica reference current produces a voltage drop replicating (i.e., equal to) the Vfix voltage across resistor 98 which is subtracted from the Vdde voltage to generate the Vdde−Vfix voltage difference for output.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An output buffer circuit, comprising:
   an output stage powered from a first supply node and second supply node and configured to drive an output pad, said output stage comprising a first cascode transistor and a first drive transistor, the first cascode transistor and first drive transistor being coupled in series between an output node coupled to said output pad and the second supply node, wherein a gate of the first cascode transistor is biased by a first bias voltage; and
   a bias voltage generator circuit configured to generate said first bias voltage, wherein the first bias voltage is set at a first supply voltage at the first supply node for any first supply voltage at the first supply node that is less than a threshold voltage, and wherein the first bias voltage is equal to a fixed voltage when the first supply voltage exceeds the threshold voltage.

2. The output buffer circuit of claim 1, wherein the first drive transistor and the first cascode transistor have source-drain paths that are directly connected in series.

3. The output buffer circuit of claim 2, wherein a drain terminal of the first cascode transistor is directly connected to the output node.

4. The output buffer circuit of claim 1, further comprising a level shifting circuit configured to receive an input signal and level shift the input signal to generate a level shifted signal that is coupled to a gate terminal of the first drive transistor.

5. The output buffer circuit of claim 4, wherein the level shifted signal has a logic low voltage level at the second supply voltage and a logic high voltage level at the first bias voltage.

6. The output buffer circuit of claim 1, further comprising:
   a voltage sensing circuit configured to sense the first supply voltage, compare the sensed first supply voltage to the threshold voltage, and to generate a control signal in response to the comparison; and
   a switching circuit configured to apply the first supply voltage as the first bias voltage in response to a first logic state of the control signal and to apply the fixed voltage as the first bias voltage in response to a second logic state of the control signal.

7. The output buffer circuit of claim 1, wherein the bias voltage generator circuit comprises a voltage regulator configured to generate the fixed voltage.

8. The output buffer circuit of claim 7, wherein voltage regulator generates a reference current to produce the fixed voltage.

9. The output buffer circuit of claim 1, wherein the fixed voltage is less than the threshold voltage.

10. The output buffer circuit of claim 1, wherein the output stage further includes a second cascode transistor coupled between the first supply node and the output node, coupled to said output pad, wherein a gate of the second cascode transistor is biased by a second bias voltage.

11. The output buffer circuit of claim 10, wherein the bias voltage generator circuit is further configured to generate said second bias voltage, wherein the second bias voltage is set at a second supply voltage at the second supply node for any first supply voltage at the first supply node that is less than the threshold voltage, and wherein the second bias voltage is equal to a difference between the first supply voltage and the fixed voltage when the first supply voltage exceeds the threshold voltage.

12. The output buffer circuit of claim 1,
   wherein said output stage further comprises a second drive transistor and a second cascode transistor, the second drive transistor and second cascode transistor being coupled in series between the first supply node and the output node, wherein a gate of the second cascode transistor is biased by a second bias voltage; and
   wherein said bias voltage generator circuit is further configured to generate said second bias voltage, wherein the second bias voltage is set at a second supply voltage at a second supply voltage for any first supply voltage that is less than the threshold voltage, and wherein the second bias voltage is equal to a difference between the first supply voltage and the fixed voltage when the first supply voltage exceeds the threshold voltage.

13. The output buffer circuit of claim 11, wherein a drain terminal of the second cascode transistor is directly connected to the output node.

14. A method for biasing an output buffer circuit powered from a first supply node and second supply node and which includes an output stage configured to drive an output pad, said output stage comprising a first cascode transistor and a first drive transistor, the first cascode transistor and first drive transistor being coupled in series between an output node coupled to said output pad and the second supply node, the method comprising:
   biasing a gate of the first cascode transistor with a first bias voltage;
   generating said first bias voltage to be set at a first supply voltage at the first supply node for any first supply voltage at the first supply node that is less than a threshold voltage;
   generating said first bias voltage to be equal to a fixed voltage when the first supply voltage exceeds the threshold voltage.

15. The method of claim 14, further comprising:
   receiving an input signal; and
   level shifting the input signal to generate a level shifted signal that is applied to a gate terminal of the first drive transistor.

16. The method of claim 15, wherein the level shifted signal has a logic low voltage level at the second supply voltage and a logic high voltage level at the first bias voltage.

17. The method of claim 14, further comprising:
   sensing the first supply voltage;
   comparing the sensed first supply voltage to the threshold voltage;
   generating a control signal in response to the comparison;
   actuating a switching circuit to apply the first supply voltage as the first bias voltage in response to a first logic state of the control signal; and
   actuating said switching circuit to apply the fixed voltage as the first bias voltage in response to a second logic state of the control signal.

* * * * *

UNITED STATES PATENT AND TRADEMARK OFFICE
CERTIFICATE OF CORRECTION

| | | |
|---|---|---|
| PATENT NO. | : 10,454,466 B1 | Page 1 of 1 |
| APPLICATION NO. | : 16/253410 | |
| DATED | : October 22, 2019 | |
| INVENTOR(S) | : Manoj Kumar Tiwari et al. | |

It is certified that error appears in the above-identified patent and that said Letters Patent is hereby corrected as shown below:

On the Title Page

Item (72) Inventors should read: Manoj Kumar Tiwari, Unnao (IN); Salyid Mohammad Irshad Rizvi, New Delhi (IN)

Signed and Sealed this
Seventh Day of February, 2023

Katherine Kelly Vidal
*Director of the United States Patent and Trademark Office*